US 8,108,172 B2

(12) United States Patent
Hirai et al.

(10) Patent No.: US 8,108,172 B2
(45) Date of Patent: Jan. 31, 2012

(54) DEFECT REVIEW APPARATUS AND METHOD OF REVIEWING DEFECTS

(75) Inventors: Takehiro Hirai, Ushiku (JP); Kenji Obara, Kawasaki (JP); Kohei Yamaguchi, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 12/953,170

(22) Filed: Nov. 23, 2010

(65) Prior Publication Data

US 2011/0062328 A1   Mar. 17, 2011

Related U.S. Application Data

(63) Continuation of application No. 12/108,068, filed on Apr. 23, 2008, now Pat. No. 7,869,969.

(30) Foreign Application Priority Data

Apr. 26, 2007   (JP) .................................. 2007-117254

(51) Int. Cl.
*G01C 17/38* (2006.01)
*G01N 21/86* (2006.01)
(52) U.S. Cl. ..................................... 702/95; 250/559.29
(58) Field of Classification Search .............. 702/35–36, 702/40, 81, 84–85, 94–95, 127, 150, 152–153, 702/159, 172, 182–183, 188–189, 193–194, 702/199; 250/201.3, 310–311, 396 R, 442.11, 250/559.4, 559.29, 559.41–559.46; 359/368, 359/380, 383, 391; 382/141, 144–145, 147–149, 382/151, 201, 255; 324/750.01–750.02, 324/750.16, 750.22–750.23, 754.21–754.23, 324/758, 765
See application file for complete search history.

(56) References Cited

U.S. PATENT DOCUMENTS

| | | | |
|---|---|---|---|
| 6,713,761 B2 | 3/2004 | Nakada et al. | |
| 6,724,005 B2 | 4/2004 | Tokumoto | |
| 6,792,359 B2 | 9/2004 | Ninomiya et al. | |
| 7,214,937 B2 | 5/2007 | Abe et al. | |
| 7,307,254 B2 | 12/2007 | Yamaguchi et al. | |
| 2002/0047098 A1* | 4/2002 | Tokumoto | 250/559.4 |

FOREIGN PATENT DOCUMENTS

| | | |
|---|---|---|
| JP | 2001-338601 A | 12/2001 |
| JP | 2002-39959 A | 2/2002 |
| JP | 2002-71594 A | 3/2002 |
| JP | 2002-131253 A | 5/2002 |
| JP | 2005-310428 A | 11/2005 |

OTHER PUBLICATIONS

Sullivan et al., SEM/EDS Analysis Method for Bare Silicon Particle Monitor Wafers, 1994 IEEE/SEMI Advanced Semiconductor Manufacturing Conference. pp. 293-296.

* cited by examiner

*Primary Examiner* — Michael Nghiem
*Assistant Examiner* — Toan M Le
(74) *Attorney, Agent, or Firm* — Crowell & Moring LLP (57) ABSTRACT

A review apparatus for reviewing a specimen by moving the specimen to pre-calculated coordinate includes: a function to measure a deviation amount between the pre-calculated coordinates and coordinates of an actual position of the specimen; a function to optimize a coordinate correcting expression to minimize the measured deviation amount; and a function to determine that the deviation amounts have converged. When the deviation amounts have converged, the measurement for the coordinate-correcting-expression optimization is terminated, and a field of view necessary for the specimen to be within the field of view is set according to a convergence value of the calculated deviation amount.

9 Claims, 5 Drawing Sheets

DEFECT REVIEW APPARATUS AND METHOD OF REVIEWING DEFECTS

CROSS REFERENCE TO RELATED APPLICATION

This application is a continuation of U.S. patent application Ser. No. 12/108,068, filed Apr. 23, 2008, now U.S. Pat. No. 7,869,969, which claims priority of Japanese Patent Application No. 2007-117254, filed on Apr. 26, 2007, the entire disclosure of which is herein expressly incorporated by reference.

BACKGROUND OF THE INVENTION

1. Field of the Invention

The present invention relates to a review apparatus for reviewing a specimen by moving a specimen stage to designated coordinates. In particular, the present invention relates to a defect review apparatus, as in a scanning electron microscope (SEM) defect review apparatus, for determining a review position by an automatic defect review (ADR) on the basis of information on a defect position detected by an inspection apparatus in an upper level.

The present invention also relates to a method and a review apparatus for setting a field of view for reviewing to have the optimum size by correcting designated coordinates and observation coordinates so that a specimen can be within the field of view for reviewing in order to achieve both high throughput and high accuracy of detecting a position of the specimen.

2. Description of the Related Art

In order to secure a high yield rate, for example, in a semiconductor fabrication process, it is important to find a defect, which occurs in the fabrication process, as early as possible to take appropriate measures against the defect as soon as possible. Nowadays, semiconductor devices are so miniaturized that even a minute defect may cause no longer negligible influence on the yield rate. For this reason, much smaller defects must be checked to avoid the yield rate decrease. An SEM defect review apparatus is one of important apparatuses for reviewing such a minute defect. In general, this kind of apparatus reviews a defect on the basis of the defect position detected in advance by an upper-level inspection apparatus such as an optical microscope and another SEM apparatus. When the defect is reviewed manually, a specimen stage is moved to the coordinates that are designated in an output from the upper-level inspection apparatus. Then, the specimen is imaged at a low magnification level at which the specimen can come within the field of view. After the defection position is visually checked, the stage is moved in a way that the defect position comes to the center of the field of view so as to acquire a defect image for reviewing at a high magnification. The apparatus having these steps automated is an automatic defect review (ADR).

The ADR performs image processing on a low magnification image for detecting a defect position (hereinafter, referred to as a "monitoring image") to detect a defect appearing within the field of view of the monitoring image. A specimen stage is moved so that the detected defect can come to the center of the field of view. Subsequently, an image for reviewing (hereinafter, referred to as "review image") is obtained at a high magnification that allows the defect to be detected easily in details. From the viewpoint of performing image processing, it is preferable to capture a monitoring image at a higher magnification to make the defect larger for reviewing. Nevertheless, if the magnification is too high, it is more likely that some defect would be outside the field of view (hereinafter, referred to as "view-field displacement"). For this reason, among the setting for the ADR, the setting of the magnification for the monitoring image is dependent on the experience of the user, and the magnification is a difficult parameter to set.

In particular, as a means for achieving both the detection of such a minute defect and the prevention of the view-field displacement together, there has been recently employed a method of enlarging the size of the field of view for reviewing without changing the magnification. However, this method requires the user to set the magnification for the monitoring image and the size of the field of view in combination, and thus produces a problem that it is even more difficult to set these parameters than otherwise.

As a method for effectively performing the magnification setting operation for the monitoring image, Japanese Patent Application Publication No. 2001-338601 (Patent Document 1) discloses a method in which a coordinate correcting expression is optimized so as to minimize the amounts of deviation between a defect position outputted from an upper-level inspection apparatus and an actually detected defect position. Moreover, Japanese Patent Application Publication No. 2002-131253 (Patent Document 2) discloses a method in which the magnification of the monitoring image is optimized on the basis of detected deviation amounts.

SUMMARY OF THE INVENTION

According to the method disclosed in Patent Document 1, it is possible to set a searching magnification according to the deviation amounts measured on the basis of the optimized coordinate correcting expression.

Nevertheless, when the upper-level inspection apparatus provides only low coordinate detection accuracy, the method in Patent Document 1 can produce only a small effect on the correction. For this reason, before the SEM performs the ADR in the SEM defect review apparatus, all the defect positions to be reviewed are generally detected by using, for example, an optical microscope which belongs to the review apparatus, and which is capable of detecting the defect position more rapidly than the SEM. When all the defect positions are detected and reviewed as described above, the throughput is considerably reduced. Accordingly, there is a demand for the development of a method of optimizing the coordinate correcting expression with processing load reduced to the minimum required level.

Moreover, a means for evaluating the correction effect is not prepared for the conventional techniques described above. Hence, even in the case where the measuring the deviation amounts at only several points is enough to produce a sufficient correction effect through the coordinate correcting expression optimization, the measurement has to continue until all a predetermined number of deviation amounts are measured. Accordingly, even in the case of using the aforementioned inspection apparatus can provide accurate coordinates, there is a demand for the development of the method of optimizing the coordinate correcting expression with processing load reduced to the minimum required level.

Furthermore, the coordinate detection accuracy varies to a large extent, depending on the type and state of the upper-level inspection apparatus. Accordingly, if the coordinates are uniformly corrected in the same process, the coordinate correction accuracy varies. With such variations, even a skilled person has a difficulty in setting a combination of the magnification for a monitoring image and the size of the field of view for reviewing so as to make the specimen be within the field of view for reviewing and concurrently to make the magnification as high as possible to improve the ADR detection accuracy. Thus, it is sought to devise a mechanism which allows any user to perform such setting easily.

An object of the present invention is to suppress the reduction in throughput for reviewing defects by simplifying a measurement operation of deviation amounts to the minimum required level. Another object of the present invention is to optimize the size of a field of view for reviewing on a monitoring image.

In order to solve the above problems, an aspect of the present invention provides a defect review apparatus for reviewing a defect on a specimen, the apparatus including: an optical detector which detects the defect on the basis of information on coordinates of the defect, the information transmitted from an external apparatus; and a calculator which calculates a difference between the information on the coordinates and coordinates of the detected defect, and which determines to continue the calculation of the difference when the value of the difference is smaller than a predetermined value.

According to another aspect of the present invention, a defect review apparatus for reviewing a defect on a specimen includes: a display device which displays an image of the specimen at a predetermined size of a field of view; an optical detector which detects the defect on the basis of information on coordinates of the defect, the information transmitted from an external apparatus; and a calculator which calculates a difference between the information on the coordinates and coordinates of the detected defect, and which determines to continue the calculation of the difference on the basis of a reference value determined depending on the value of the difference and the size of the field of view.

According to another aspect of the present invention, a defect review apparatus for reviewing a defect on a specimen includes: a display device which displays an image of the specimen at a predetermined size of a field of view; an optical detector which detects the defect on the basis of information on coordinates of the defect, the information transmitted from an external apparatus; and a calculator which calculates a difference between the information on the coordinates and coordinates of the detected defect, and the calculation of the difference is determines to be continued when the value of the difference calculated by the calculator is within a reference value determined on the basis of a size of a field of view.

According to another aspect of the present invention, a defect review apparatus for reviewing a defect on a specimen includes: a display device which displays an image of the specimen at a predetermined size of a field of view; an optical detector which detects the defect on the basis of information on coordinates of the defect, the information transmitted from an external apparatus; and a calculator which calculates a difference between the information on the coordinates and coordinates of the detected defect, and which determines to continue the calculation of the difference when the defect appears in the image of the specimen displayed on the display device.

According to another aspect of the present invention, a defect review apparatus for reviewing a defect on a specimen by moving the specimen to a pre-calculated coordinate position in a first coordinate system to specify a position of the specimen by a second coordinate system includes: a deviation-amount measurement unit which measures a deviation amount between the pre-calculated coordinate position and an actual position of the specimen; a coordinate-correcting-expression optimizing unit which optimizes a coordinate correcting expression for converting the second coordinate system to the first coordinate system so as to minimize the measured deviation amount; and a deviation-amount-convergence determination unit which determines that the deviation amount has converged, and the measurement for optimizing the coordinate correcting expression is terminated when the deviation amount has converged.

According to another aspect of the present invention, a defect review apparatus for reviewing a defect on a specimen by moving the specimen to a pre-calculated coordinate position in a first coordinate system to specify a position of the specimen by a second coordinate system includes: a deviation-amount measurement unit which measures a deviation amount between the pre-calculated coordinate position and an actual position of the specimen; a coordinate-correcting-expression optimizing unit which optimizes a coordinate correcting expression for converting the second coordinate system to the first coordinate system so as to minimize the measured deviation amount; and a deviation-amount-convergence determination unit which determines that the deviation amount has converged, and the measurement for optimizing the coordinate correcting expression is terminated at a time when a convergence value of the deviation amount is equal to or less than a predetermined value.

According to another aspect of the present invention, provided is a method of reviewing a defect on a specimen by moving the specimen to a pre-calculated coordinate position in a first coordinate system to specify a position of the specimen by a second coordinate system, the method including the following steps of: measuring a deviation amount between the coordinate position in the first coordinate system and a coordinate position in the second coordinate system, and starting fine alignment process for optimizing a coordinate correcting expression so as to minimize the deviation amount; repeating a procedure for optimizing the coordinate correcting expression and concurrently for measuring a deviation between coordinates corrected on the basis of the coordinate correcting expression and coordinates of a position of the specimen actually detected; determining that the deviation amount has converged; and continuing the fine alignment process when the deviation amount has not converged, and setting a field of view for reviewing to be equal to or greater than a convergence value of the deviation, terminating the fine alignment process, and starting an ADR, when the deviation amount has converged.

It is preferable that the method of reviewing a defect further include the steps of: comparing the convergence value of the deviation amount with a FOV in terms of size; and terminating the fine alignment process and starting the ADR when the convergence value of the deviation amount is equal to or less than the FOV, and enlarging the FOV of the ADR with a reviewing magnification maintained when the convergence value is greater than the set FOV.

The present invention may be a program which causes a computer to execute the above-described steps, or may be a computer-readable storage medium storing the program therein.

According to the present invention, the measurement for optimizing the coordinate correcting expression is terminated when the deviation amount has converged by using the coordinate correcting expression. Thereby, the reduction in the throughput is suppressed to the minimum level.

Furthermore, a FOV which is necessary for a specimen to be within the field of view for reviewing is automatically set according to the calculated convergence value of the deviation amounts. Thereby, it is possible to reduce the frequency of failure in detecting specimen positions caused by an incident that the specimen is not within the field of view at the time of performing the ADR.

DETAILED DESCRIPTION OF THE PREFERRED EMBODIMENTS

This application is based on the Japanese Patent application JP2007-117254, all the contents of which is incorporated in this application by reference.

Figure 1:
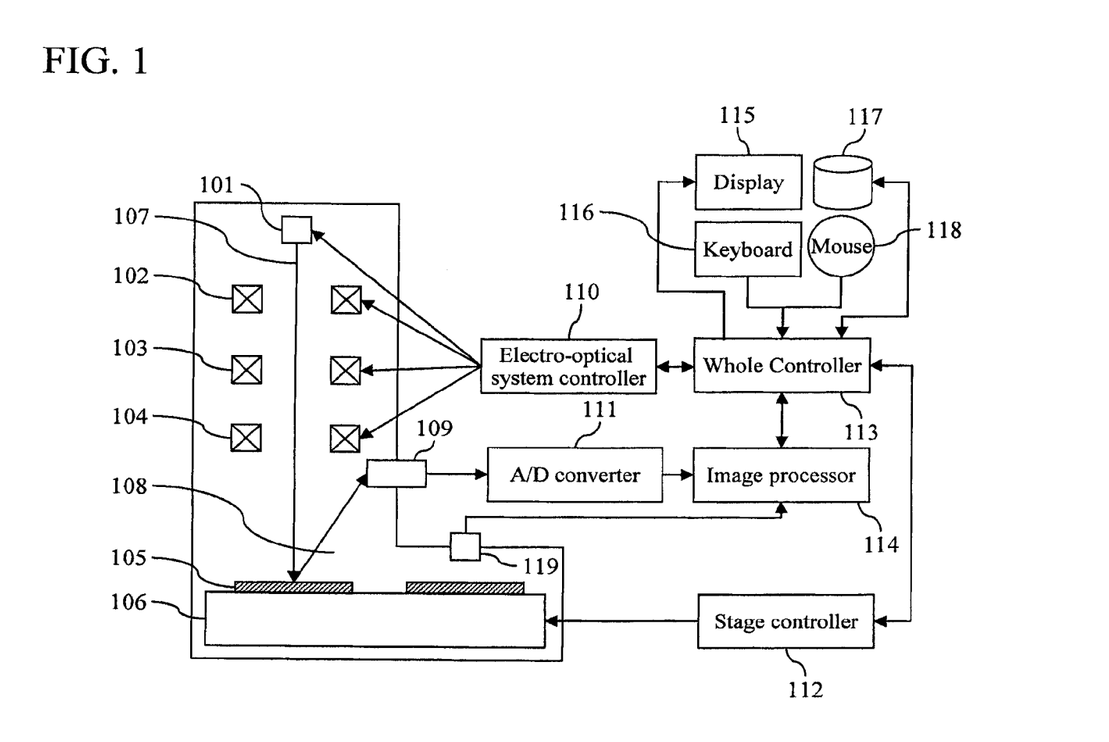
FIG. 1 is a cross-sectional view showing a basic configuration of a SEM semiconductor defect review apparatus according to one embodiment of the present invention.

Hereinafter, description will be given of a defect review apparatus according to one embodiment of the present invention with reference to drawings. FIG. 1 is a cross-sectional view showing a configuration example of a SEM defect review apparatus according to this embodiment. The SEM defect review apparatus shown in FIG. 1 includes an electron gun 101, a lens 102, a deflector 103, an objective lens 104, a specimen 105, a stage 106, a secondary particle detector 109, an electro-optical system controller 110, an A/D converter 111, a stage controller 112, a whole controller 113, an image processor 114, a display 115, a keyboard 116, a storage 117, a mouse 118 and an optical microscope 119. An electron beam 107 emitted from the electron gun 101 is focused by the lens 102, deflected by the deflector 103, and then focused by the objective lens 104 before the electron beam 107 irradiates the specimen 105. The specimen 105 thus irradiated with the electron beam 107 generates a secondary particle 108 such as a secondary electron and a reflection electron, depending on the shape and material of the specimen. The secondary particle 108 thus generated is detected by the secondary particle detector 109, converted into a digital signal by the A/D converter 111, and thereby a SEM image is formed. Using the SEM image thus formed, the image processor 114 performs image processing for detecting a defect and the like. The lens 102, the deflector 103, and the objective lens 104 are controlled by the electro-optical system controller 110. The position of the specimen is adjusted by the stage 106 that is controlled by the stage controller 112. The whole controller 113 interprets an input signal transmitted from the keyboard 116, the storage 117, the mouse 118, and controls the electro-optical system controller 110, the stage controller 112, the image processor 114, and the like. If necessary, the whole controller 113 outputs the contents of processing to the display 115 and the storage 117.

Figure 2:
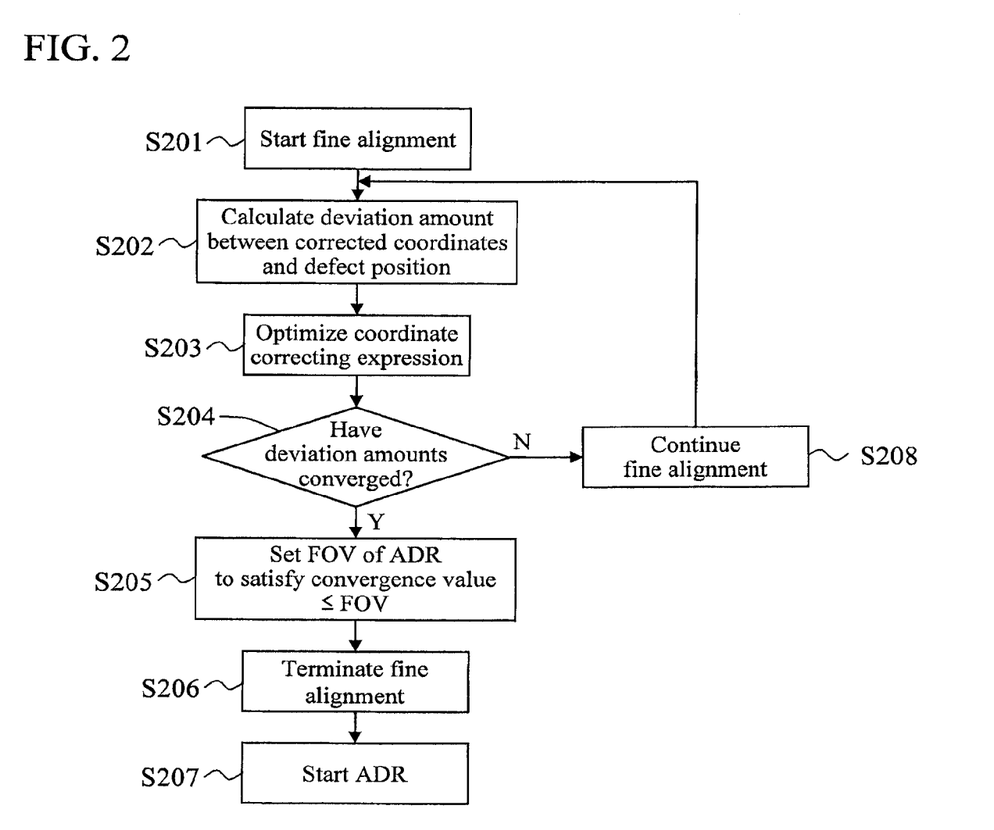
FIG. 2 is a flowchart showing a process flow for a termination determination of a fine alignment process and a FOV optimization according to this embodiment.

FIG. 2 is a flowchart showing a process flow for suppressing a reduction in the throughput of the apparatus by minimizing the measurement of a deviation amount, and for optimizing a size of a field of view for reviewing (hereinafter, referred to as FOV). Firstly, fine alignment process is started (S201) prior to an ADR. In the fine alignment process, a coordinate correcting expression is optimized so as to minimize a deviation amount (i.e., a difference in coordinates) which has been calculated. The deviation amount is a difference between a position of a specimen outputted by an upper-level inspection apparatus, and that actually detected by the review apparatus. In Step S201 of the fine alignment process, Step 202 and S203 are repeatedly executed. In Step 202, a deviation is measured between coordinates corrected according to the coordinate correcting expression and that of a position of the specimen actually detected. Thereafter in Step 203, the coordinate correcting expression is optimized.

Incidentally, the following formula can be used as an example of the coordinate correcting expression.

For example, as described in Patent Document 1, in a case where factors of a coordinate error are an origin offset (a, b), a rotating error $\beta$, dimensional accuracy errors m and n of the respective x- and y-axes, and a perpendicularity error $\alpha$ of the coordinate axes, the coordinate converting expression is represented by the following Formula (1):

$$\begin{pmatrix} x \\ y \end{pmatrix} = \begin{pmatrix} m(\cos\beta + \sin\beta \tan\alpha) & -\dfrac{n\sin\beta}{\cos\alpha} \\ m(\sin\beta - \cos\beta \tan\alpha) & \dfrac{n\cos\beta}{\cos\alpha} \end{pmatrix} \begin{pmatrix} x_1 \\ y_1 \end{pmatrix} + \begin{pmatrix} a \\ b \end{pmatrix} \quad (1)$$

where
(x1, y1): coordinates of an object, measured by an object inspection apparatus,
(x, y): coordinates of the object, converted for a SEM coordinates system,
(a, b): an error of the coordinate origin of the object inspection apparatus,
m: a dimensional accuracy error of the x-axis of the object inspection apparatus,
n: a dimensional accuracy error of the y-axis of the object inspection apparatus,
$\alpha$: a perpendicularity error of coordinates of the object inspection apparatus, and
$\beta$: an angular error between the coordinate axes.

The coordinate converting expression is created by determining the parameters a, b, m, n, $\alpha$ and $\beta$ by using a method of least squares so that the coordinates (x1, y1) of the object measured by the object inspection apparatus may be equal to the coordinates (x, y) of the object measured by the SEM with high accuracy. The resulting coordinate converting expression is used to correct the coordinates from the object inspection apparatus to those for the SEM. This correction can be performed, for example, by software in a computer.

As the coordinate correcting expression, the following formulas as described in Patent Document 2 may be used:

$$dX = a + b*X - c*Y \quad (2)$$

$$dY = d + e*Y + f*X \quad (3)$$

where
dX: a position correction amount in the x-axis direction,
dY: a position correction amount in the y-axis direction,
X: a defect position in the x-axis direction in a coordinate detection system,
Y: a defect position in the y-axis direction in the coordinate detection system,
a: a constant for an offset component in the x-axis direction of a coordinate review system, with respect to the coordinate detection system, b: a constant (coefficient) for a magnification component in the x-axis direction of the coordinate review system, with respect to the coordinate detection system, c: a constant (coefficient) for a rotation component in the x-axis direction of the coordinate review system, with respect to the coordinate detection system, d: a constant for the offset component in the y-axis direction of the coordinate review system, with respect to the coordinate detection system, e: a constant (coefficient) for the magnification component in the y-axis direction of the coordinate review system, with respect to the coordinate detection system, and f: a constant (coefficient) for the rotation component in the y-axis direction of the coordinate review system, with respect to the coordinate detection system.

Note that, regarding the rotation component of the coordinate review system with respect to the coordinate detection system, the counterclockwise direction of rotation is taken to be positive.

The present defect review apparatus may have a mechanism to select and use any of the above formulas.

The deviation may be caused by an error in a coordinate detection accuracy including a stage-moving accuracy of the upper-level inspection apparatus, an error in stage-moving accuracy of the review apparatus, and the like. It is relatively easy for the review apparatus to control and correct the error in stage-moving accuracy of the review apparatus. Meanwhile, it is difficult for the review apparatus to correct the error caused by the various kinds of upper-level inspection apparatuses. For this reason, generally, the deviation amount is measured and the parameters of the coordinate correcting expression are changed in every review to optimize the coordinate correcting expression. Moreover, the correction accuracy tends to be improved by increasing the number of measurement points for the deviation amount, and by increasing the number of optimization of the coordinate correcting expression. However, the degree of the improvement in the correction accuracy varies depending on the type, state and setting condition of the upper-level inspection apparatus. Thus, it is extremely difficult to determine how many times the optimization should be repeated in advance.

Against this background, when the accuracy in coordinates designated by the upper-level inspection apparatus is predicted to be poor, the fine alignment is performed on all the objects to be reviewed so as to allow the specimen to be surely observed rather than to improve the throughput, in general. Note that, in this embodiment, any formula can be used for the coordinate correcting expression. For example, the one described in Patent Document 1 may be used, or other formulas may also be used. Next, after the deviation amounts are calculated, it is determined whether or not the deviation amounts have converged, and then whether to continue the fine alignment process (S204). When the deviation amounts are not converged, the calculation of the deviation amount is continued in the fine alignment process (S208). When the deviation amounts have converged, the field of view of the ADR is set to be equal to or greater than the convergence value of the deviations (S205). Then, the fine alignment process is terminated to stop the calculation of the deviation amount (S206), and the ADR is started (S207).

Figure 3:
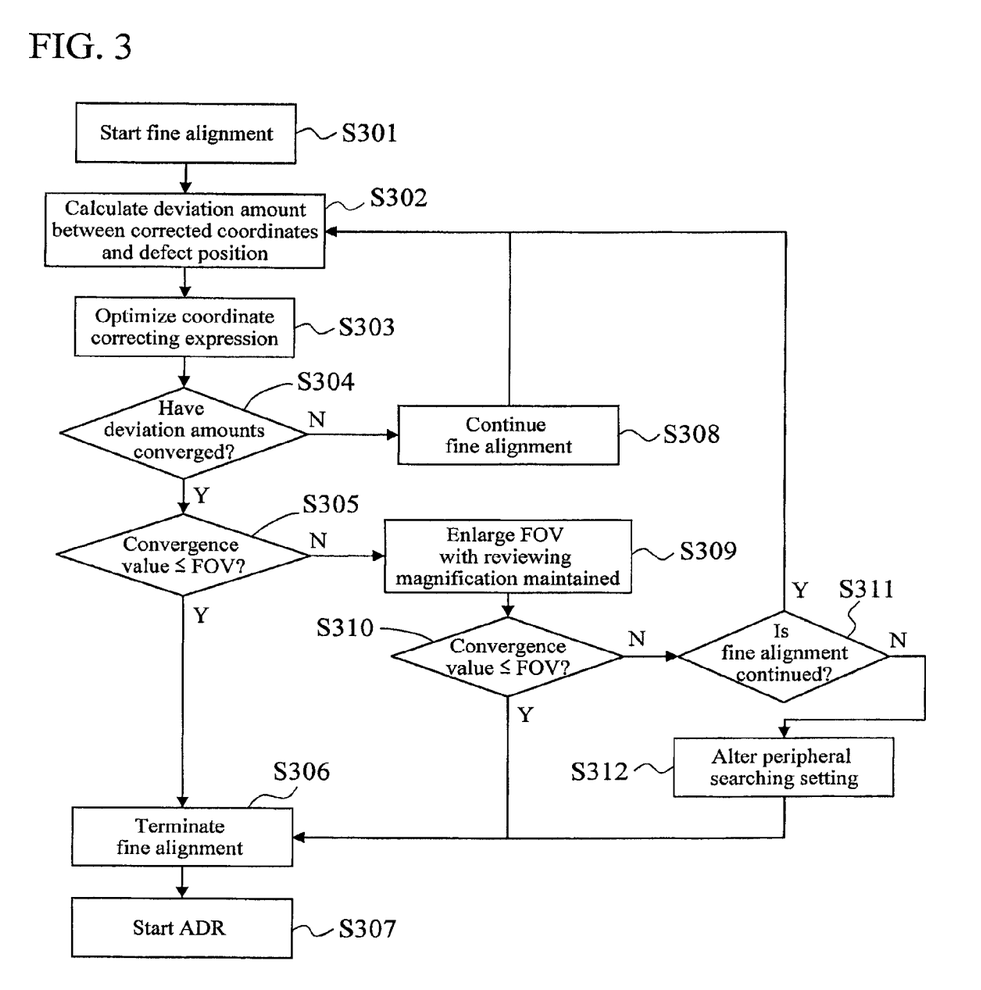
FIG. 3 is a flowchart for the termination determination of the fine alignment process, the FOV optimization, and an optimization of a peripheral searching setting.

FIG. 3 is a flowchart showing a process flow for optimizing a FOV if the FOV calculated on the basis of the convergence value of the deviation amounts does not satisfy a condition for setting the FOV in the apparatus. The case where the FOV does not satisfy the condition for setting the FOV in the apparatus means, for example, that the convergence value is so large and greater than the maximum FOV value settable the apparatus. This indicates that a defect exists outside the FOV. Thus, a peripheral searching function is activated in Step S312 of FIG. 3 to be described later.

Processes shown in Steps S301, S302, S303, S304, S306, S307 and S308 are the same as those in Steps S201, S202, S203, S204, S206, S207 and S208 of FIG. 2. In Step S305, the convergence value of the deviation amounts and the FOV are compared with each other in terms of size. When the convergence value of the deviation amounts is equal to or less than the FOV, the fine alignment process is terminated (S306), and then the ADR is started (S307).

At this point, the present apparatus has the following advantage regarding other portions of the specimen to be reviewed. Since the deviation amounts have converged, the other portions of the specimen to be reviewed are expected to be within a field of view with the set FOV. Accordingly, the ADR can be performed without the fine alignment process, and thus the throughput is improved. When the convergence value is determined to be greater than the set FOV in Step 305, the FOV of the ADR is enlarged while the reviewing magnification is maintained (S309). The reviewing magnification is maintained here, in order not to reduce the detection sensitivity of the ADR. To be more specific, if the reviewing magnification is reduced, the size of view to capture an image of the same size as that without reducing the magnification is made to be larger. However, the amount of information per pixel is reduced. As a result, the detection sensitivity in the image processing is reduced. Thus, the image size is enlarged without reducing the reviewing magnification. For this reason, an increasing number of review apparatuses are available, which have a function to capture an image of various sizes. Nevertheless, due to the restriction from the hardware and software, typically the user selects an image size among several image sizes which are already prepared. On the other hand, when the image size is enlarged, it is less likely that the specimen would be out of the field of view, but the image processing time for detecting a defect is increased because the defect has to be searched out in a wide field of view. Thus, the image size cannot be enlarged freely. For this reason, appropriate setting of an image size is a bothersome operation especially for an inexperienced user.

After the FOV is enlarged with the reviewing magnification maintained (S309), the convergence value and the FOV enlarged in Step S309 are compared with each other in terms of size again (S310). When the convergence value is equal to or less than the enlarged FOV, the specimen is expected to be reviewed within the field of view, and thus the fine alignment process is terminated (S306), and then the ADR is started (S307). Meanwhile, when the convergence value is greater than the enlarged FOV, it is determined whether to continue the fine alignment process (S311). As fine alignment is performed a larger number of times, the deviation amount is decreased, in other words, the convergence value tends to be small. Accordingly, the continuous iterative execution of the fine alignment process increases the likelihood of obtaining the convergence value within the range of the FOV settable in the apparatus. In a case where the fine alignment process is determined not to be continued, it is expected that the specimen may not be within the field of view only by the single capturing. In this case, a peripheral searching setting is made to observe the peripheral field of view (S312).

Figure 4:
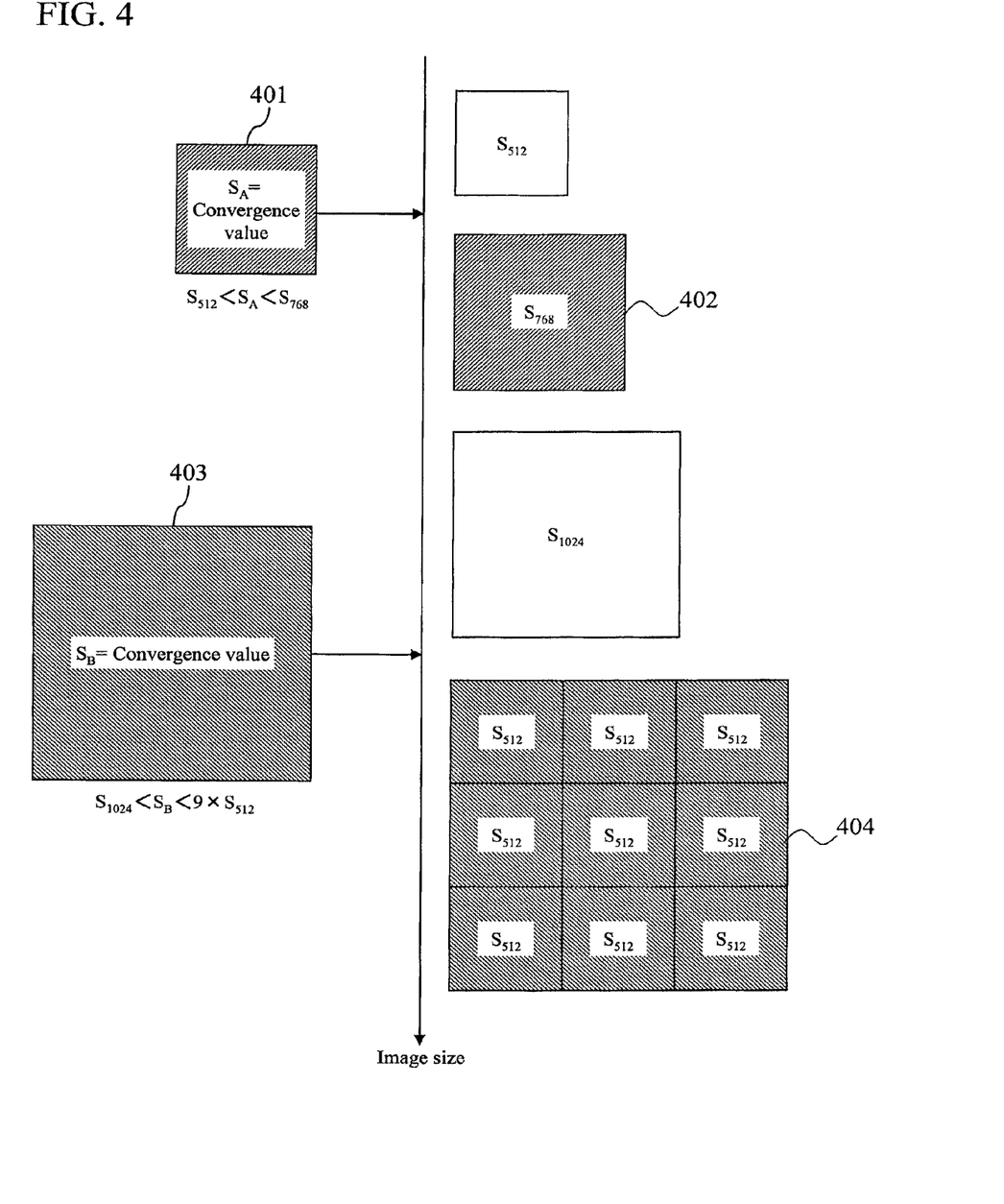
FIG. 4 is a diagram showing the relationship between an image size and the peripheral searching setting.

FIG. 4 is a schematic view for explaining an optimization process for the peripheral searching setting in the ADR. As an example, description will be given of a case where a required pixel size is selected among image sizes of 512×512 pixels, 768×768 pixels and 1024×1024 pixels.

In this description, for instance, the image size is represented by S, and the number of pixels of that image is represented by a subscript. A required image size $S_A$ is determined based on the convergence value from the fine alignment, the minimum defect size to be detected and the image processing performance. When the required image size $S_A$ satisfies, for example, $S_{512} < S_A < S_{768}$ (401), the image size of the ADR is set to be $S_{768}$ (402) whose pixel number is higher in view of the margin.

Meanwhile, when a required image size $S_B$, which is determined based on the convergence value from the fine alignment, the minimum defect size to be detected and the image processing performance, satisfies $S_{1024} < S_B$ (403), the specimen may not be within the field of view only by the single capturing. Accordingly, it is necessary to perform the following peripheral searching setting. Reference numeral 404 in FIG. 4 shows an example of searching the peripheral field of view with the images each having an image size of 512×512 pixels. Although it is also possible to search the periphery with image sizes of 768×768 pixels or 1024×1024 pixels, the nine images each having the minimum pixel size of 512×512 pixels are used to search the periphery in the reference numeral 404, since the smaller image size may shorten the image processing time. As shown in the reference numeral 404, the images each having the image size of 512×512 pixels are disposed, centered on the image having the same image size of 512×512 pixels, in four directions: that is, top-to-down, left-to-right and oblique directions. These images thus form a large single image of 1536×1536 pixels, which is actually divided into the nine images each having the image size of 512×512 pixels. With this operation, it becomes possible to increase the processing speed, for example, by performing the processing on the nine images each having the image size of 512×512 pixels simultaneously. It is also possible to search out a defect more rapidly by giving priority to the images in the searching order in a way that the top priority is given to the image at the center, and that the subsequent priorities are given to the images in the top-to-down, left-to-right, and oblique directions.

Figure 5:
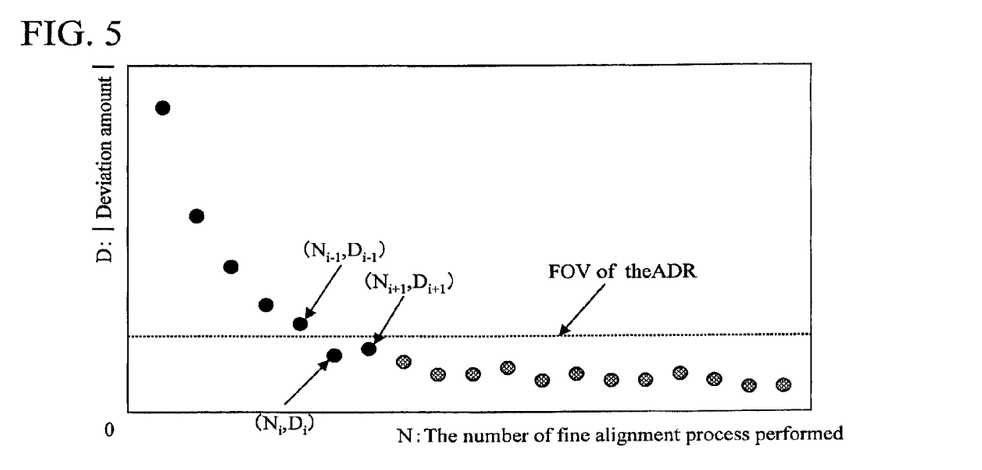
FIG. 5 is a diagram showing the relationship among the number of the fine alignment process performed, deviation amounts, and the FOV.

FIG. 5 is a graph for explaining an example of a convergence determination method according to this embodiment, and showing the relationship between the number N, of the fine alignment process performed and an absolute value D, of the deviation amount. A line of the FOV indicates a reference value determined on the basis of the size of the FOV, and the line can be set in advance, and can also be altered. As the number N of the fine alignment process performed increases, the absolute value D decreases and comes to converge. Any type of convergence determination method can be used in this embodiment. As a simple example, the convergence is determined to be completed when the absolute value D becomes equal to or less than the predetermined FOV value. Nevertheless, this is not to determine that the absolute value D of the deviation amount has truly converged. Thus, even when the FOV value is set to be smaller, it might be determined that the absolute value of the deviation amount has converged, although it has not. Thus, even when the absolute value D of the deviation amount becomes equal to or less than the predetermined FOV value, it is necessary to further perform several measurements or several tens of measurements until the deviation amount would be determined to substantially converge, and then the convergence should be determined to be completed.

As another example, it is possible to use an algorithm to determine that the convergence has been completed when the ratio of a measured deviation amount $D_n$ to a deviation amount $D_{n-1}$ measured immediately before the measurement of $D_n$ is equal to or less than a set value $\epsilon$ as represented by the following Formula (4). In order to further improve the accuracy, it is possible to add a condition that $D_n$ is equal to or less than a certain value, or to add a condition to determine that the deviation amount has converged when Formula (4) is consecutively satisfied by a certain number of times.

$$D_n/D_{n-1} < \epsilon \qquad (4)$$

For example, in FIG. 5 showing the relationship between the number N of the fine alignment process performed and the deviation amount D, when it is determined that the convergence has been completed at $N_{i+1}$ (the last plot shown by black circle), the FOV of the ADR is set equal to or above $D_{i+1}$ corresponding to $N_{i+1}$. The fine alignment process is then terminated, and the ADR can be performed. In this manner according to Formula (4), the processing is simplified because it is possible to determine that the convergence has been completed in a case where the deviation amount becomes equal to or less than a certain value, for example a case where the ratio of the deviation amount $D_n$, when the convergence condition is measured, to the deviation amount $D_{n-1}$ measured immediately before the measurement of $D_n$ is equal to or less than the set value $\epsilon$, or in a case where the above condition is recognized several times. Moreover, there is another advantage that, even when a variation in the deviation amounts is large and the convergence value is unknown, the processing is further simplified because the FOV of the ADR can be set to be approximate to the convergence value.

Figure 6:
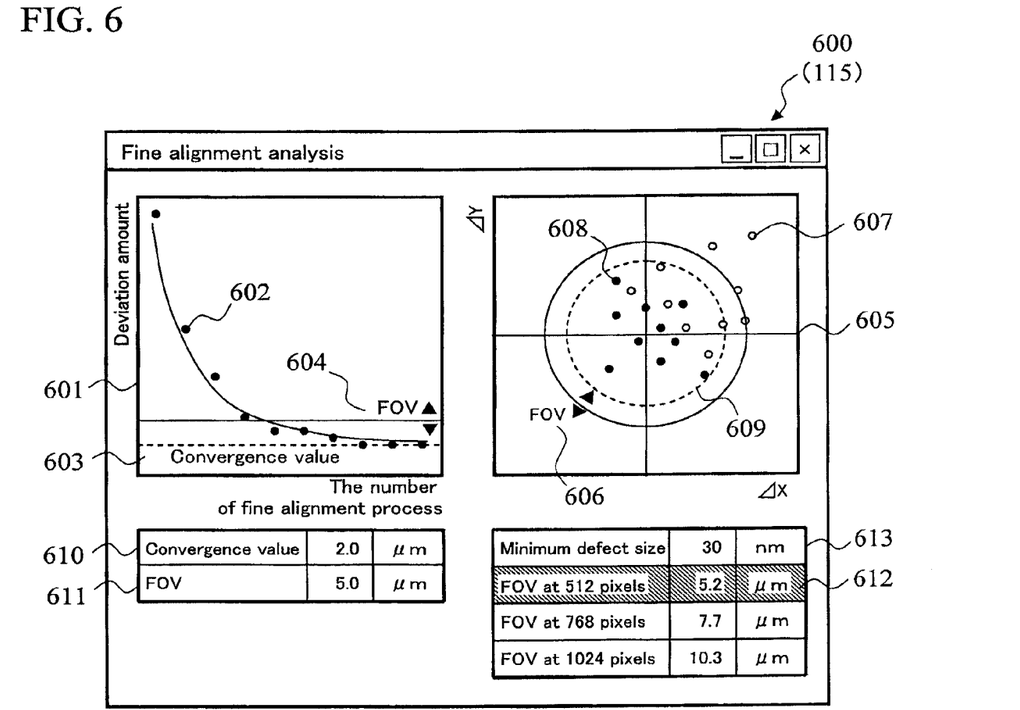
FIG. 6 shows an example of a GUI for analyzing the fine alignment and for setting the FOV.

FIG. 6 shows an example of a GUI for checking a FOV which is automatically set by analyzing the fine alignment result, and for manually setting a FOV. In the screen, the FOV is displayed as a mark like a straight line or a circle, and it is possible to set a FOV in advance, or to alter the position thereof. Reference numeral 601 in FIG. 6 denotes a screen (corresponding to the reference numeral 115 in FIG. 1), and displays a graph showing the relationship between the deviation amount and the number of times of the fine alignment. In the graph, a deviation amount 602 at each measurement point, a convergence value 603 of the deviation amounts, and a FOV 604 are shown. The setting of the FOV 604 can be altered by a drag-and-drop operation using a pointing device such as a mouse, or by a scroll button (▲ or ▼ in the drawing). A screen 605 displays a graph showing a change in the deviation amount before and after the coordinate correcting expression optimization. Specifically, the screen 605 displays a FOV 606 and both of deviation amounts 607 at each measurement point before the coordinate correcting expression optimization and deviation amounts 608 at each measurement point after the coordinate correcting expression optimization. The deviation amount 607 is shown by a white circle ○, and the deviation amount 608 is shown by a black circle ●. A dashed line 609 indicates a convergence value corresponding to the convergence value 603 of the deviation amounts. It is found that the deviation amounts after the coordinate correcting expression optimization are settled equal to or below the convergence value. The setting of the FOV 606 can be altered by a drag-and-drop operation using a pointing device such as a mouse, or by a scroll button (▲ or ▼ in the drawing).

A table 610 displays a convergence value of the deviation amounts and a FOV 611. As to the FOV 611, a numerical value can be inputted and updated using an input device such as a keyboard. The FOV 604 on the screen 601, the FOV 606 on the screen 605, and the FOV 611 in the table 610 are connected with one another, and therefore the result of altering the setting for any one of these parameters is automatically reflected to the other two parameters. A table 612 displays a minimum defect size 613 to be detected by the ADR, and a maximum FOV value in each image size, the maximum FOV value being calculated on the basis of the relationship between the minimum defect size 613 and the image processing performance.

As to the minimum defect size 613, a numerical value can be inputted and updated using an input device such as a keyboard. For example, in a case where the present apparatus has an image processing performance to detect a difference of 3 or more pixels, and where the minimum defect size is set to 30 nm, it is possible to detect the difference of 10 nm per pixel. Accordingly, it is possible to calculate that the maximum FOV is: 5.2 μm when the image size is 512×512 pixels; 7.7 μm when the image size is 768×768 pixels; and 10.3 μm when the image size is 1024×1024 pixels.

Generally, since a smaller image size may shorten the time for defect detection processing by the ADR, an image size which meets the set FOV and has a minimum number of pixels is selected. In FIG. 6, it is advantageous to select the image size of 512×512 pixels in terms of throughput.

Incidentally, among the screens shown in FIG. 6, it is not always necessary to prepare all of these, and is only necessary to set at least any one of: the graph on the screen 601 showing the relationship between the deviation amount and the number of times of fine alignment process; the graph on the screen 605 showing a change in the deviation amounts before and after the coordinate correcting expression optimization; the convergence value of the deviation amounts and the FOV 611 in the table 610; and the maximum FOV value in each image size in the table 612. Alternatively, displaying of these screens may be altered by switching these screens one after another.

As has been described thus far, according to this embodiment, the measurement for the coordinate correcting expression optimization is terminated once the deviation amounts converge by using the coordinate correcting expression. Thereby, it is possible to suppress the reduction in the throughput to the minimum level. Furthermore, a FOV which is necessary for a specimen to be within the field of view is automatically set according to the calculated convergence value of the deviation amounts. Thereby, it is possible to reduce the frequency of failure in detecting specimen positions caused by an incident that the specimen is not within the field of view at the time of performing the ADR.

The present invention further includes the following aspects.

11. A defect review apparatus for reviewing a defect on a specimen includes:
an optical detector which detects the defect on the basis of information on coordinates of the defect, the information transmitted from an external apparatus; and
a calculator which calculates a difference in coordinates between the information on the coordinates and coordinates of the detected defect, and which compares the difference with a predetermined value.

12. In the defect review apparatus as set forth in 11, the calculator determines to continue the calculation of the difference when the value of the difference is smaller than the predetermined value.

13. In the defect review apparatus as set forth in 11, the calculator determines whether to stop the calculation of the difference when the value of the difference is smaller than the predetermined value.

14. In the defect review apparatus as set forth in 11, the calculator stops the calculation of the difference when the value of the difference is smaller than the predetermined value.

15. A defect review apparatus for reviewing a defect on a specimen includes:
a display device which displays an image of the specimen together with a mark showing a size of a field of view;
an optical detector which detects the defect on the basis of information on coordinates of the defect, the information transmitted from an external apparatus; and
a calculator which calculates a difference in coordinates between the information on the coordinates and coordinates of the detected defect, and which compares the difference with a reference value determined on the basis of the size of the field of view.

16. In the defect review apparatus as set forth in 15, the calculation of the difference is determined to be continued when the value of the difference calculated by the calculator is within the reference value determined on the basis of the size of the field of view.

17. In the defect review apparatus as set forth in 16, the reference value can be altered.

18. In the defect review apparatus as set forth in 15, whether to stop the calculation of the difference is determined when the value of the difference calculated by the calculator is within the reference value determined on the basis of the size of the field of view.

19. In the defect review apparatus as set forth in 18, the reference value can be altered.

20. In the defect review apparatus as set forth in 15, the calculation of the difference is stopped when the value of the difference calculated by the calculator is within the reference value determined on the basis of the size of the field of view.

21. In the defect review apparatus as set forth in 20, the reference value can be altered.

22. A defect review apparatus for reviewing a defect on a specimen includes:
a display device which displays an image of the specimen;
an optical detector which detects the defect on the basis of information on coordinates of the defect, the information transmitted from an external apparatus; and
a calculator which calculates a difference in coordinates between the information on the coordinates and coordinates of the detected defect, wherein the calculator determines to continue the calculation of the difference depending on whether or not the defect appears in the image of the specimen displayed on the display.

23. In the defect review apparatus as set forth in 22, the calculator stops continuing the calculation of the difference when the defect appears in the image of the specimen displayed on the display.

24. In the defect review apparatus as set forth in 22, the calculator causes the display to display a mark indicating a reference for the determination whether to continue the calculation of the difference.

25. In the defect review apparatus as set forth in 24, a position of the mark can be altered.

26. In the defect review apparatus as set forth in 22, when the defect does not appear in the image of the specimen displayed on the display, an image of a region adjacent to the image of the specimen is captured, and this capturing is repeated until the defect appears.

27. A defect review apparatus for reviewing a defect on a specimen includes:
an input unit which receives information on coordinates of the defect, the information transmitted from an external apparatus;
a calculator which executes a desired calculation on the basis of at least the information on the coordinates; and
a display unit which displays a result of the calculation executed by the calculator, wherein the calculator causes the display unit to display a change in the degree of a difference between the coordinates of the information and coordinates of the defect detected on the basis of the information on the coordinates.

28. In the defect review apparatus as set forth in 27, the calculator causes the display unit to display the degree of the difference when the change in the degree of the difference becomes smaller than a predetermined value.

29. A defect review apparatus for reviewing a defect on a specimen includes:
  an input unit which receives information transmitted from an external apparatus;
  a calculator which executes a desired calculation on the basis of at least the information; and
  a display unit which displays a result of the calculation executed by the calculator, wherein:
  the input unit receives coordinates of a targeted position on the specimen, the coordinates transmitted from the external apparatus, and
  when the coordinates of the targeted position on the specimen, which is transmitted from the external apparatus, are provided in a plurality and are set as first coordinates, and when a plurality of coordinates of targeted positions which correspond to the targeted positions on the specimen disposed on a stage, are set as second coordinates, the calculator corrects the second coordinates to reduce a difference between the first coordinates and the second coordinates, and repeats the correction of the second coordinates to reduce an error, and
  when it is determined that the difference has converged, the calculator causes the display unit to display a result of the convergence.

30. In the defect review apparatus as set forth in 29, the display unit displays a determination value for determining that the difference has converged.

31. In the defect review apparatus as set forth in 29, the calculator determines, on the basis of the result of the convergence of the difference, an image magnification for reviewing the targeted position and a FOV.

32. In the defect review apparatus as set forth in 31, the display unit displays the image magnification and the FOV determined by the calculator.

What is claimed is:

1. A defect review apparatus for observing a defect on a sample based on defect coordinate information provided by an external inspection apparatus, said defect review apparatus comprising:
  a stage for moving the sample;
  an electro-optical system for irradiating the sample with an electron beam, and detecting secondary particles;
  an A/D converter for obtaining an image of said sample based on said secondary particles;
  an image processor for specifying a coordinate position of the defect using said image;
  a processing unit which calculates a difference between the coordinate position of the defect and said coordinate information, and executes an iterative correcting process which corrects a deviation amount, being a difference between a coordinate system of said inspection apparatus and a coordinate system of said defect review apparatus;
  wherein the processing unit compares the calculated difference to a predetermined criterion, and causes the correcting process to be continued if the deviation amount has not converged, and causes the correcting process to be terminated if the deviation amount has converged.

2. The defect review apparatus according to claim 1, wherein said pre-determined criterion is the deviation amount of a coordinate system of said inspection apparatus to a coordinate system of said defect review apparatus.

3. The defect review apparatus according to claim 1, wherein said predetermined criterion is a value that is determined based on a size of field of view.

4. The defect review apparatus according to claim 1, wherein said predetermined criterion is whether or not said defect appears in said image.

5. The defect review apparatus according to claim 4, wherein, when said defect does not appear in said image, the electro-optical system gets an other image of said sample, which other image is adjacent to said image.

6. The defect review apparatus according to claim 1, wherein said predetermined criterion is changeable.

7. The defect review apparatus according to claim 1, further comprising:
  a display unit for displaying the result of the calculation executed by the processing unit;
  wherein the display unit displays a transition of the deviation amount between the coordinate position of the defect and said coordinate information.

8. The defect review apparatus according to claim 1, further comprising:
  a display unit for displaying the result of the calculation executed by the processing unit;
  wherein the display unit displays a size of a field of view, which size is determined from the deviation amount of the coordinate systems.

9. The defect review apparatus according to claim 1, wherein:
  the coordinate information sent from the inspection apparatus comprises plural coordinate information;
  the electro-optical system guides the electron beam to a coordinate position corresponding to each coordinate information;
  the A/D converter obtains images of said coordinate positions;
  the processing unit corrects the deviation amount based on a result of the calculation of a difference between the coordinate position of the defect and each coordinate information, in order.

* * * * *